United States Patent
Hwang et al.

(10) Patent No.: US 6,638,802 B1
(45) Date of Patent: Oct. 28, 2003

(54) FORMING STRAINED SOURCE DRAIN JUNCTION FIELD EFFECT TRANSISTORS

(75) Inventors: Jack Hwang, Portland, OR (US); Craig Andyke, Portland, OR (US); Mitchell Taylor, Lake Oswego, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/176,336

(22) Filed: Jun. 20, 2002

(51) Int. Cl.$^7$ .......................................... H01L 21/8234
(52) U.S. Cl. ...................... 438/197; 438/299; 438/301; 438/303; 438/305
(58) Field of Search ................................ 438/197, 199, 438/299, 301, 303, 305, 306, 516, 528

(56) References Cited

U.S. PATENT DOCUMENTS

| | | | | |
|---|---|---|---|---|
| 5,266,510 A | * | 11/1993 | Lee .............................. | 438/298 |
| 5,566,212 A | * | 10/1996 | Boytim et al. .............. | 375/333 |
| 6,319,798 B1 | * | 11/2001 | Yu ............................... | 438/527 |
| 6,368,947 B1 | * | 4/2002 | Yu ............................... | 438/530 |
| 6,475,885 B1 | * | 11/2002 | Sultan ......................... | 438/514 |
| 6,486,510 B2 | * | 11/2002 | Brown et al. ................ | 257/327 |
| 2002/0086502 A1 | * | 7/2002 | Liu et al. ..................... | 438/530 |

* cited by examiner

Primary Examiner—Tuan H. Nguyen
(74) Attorney, Agent, or Firm—Trop, Pruner & Hu, P.C.

(57) ABSTRACT

By providing a high dose germanium implant and then forming a P-type source/drain extension, a strained source/drain junction may be formed. The strained source/drain junction may be shallower and have lower resistivity in some embodiments.

18 Claims, 3 Drawing Sheets

FORMING STRAINED SOURCE DRAIN JUNCTION FIELD EFFECT TRANSISTORS

BACKGROUND

This invention relates generally to integrated circuits and, particularly, to techniques for making metal oxide semiconductor field effect transistors (MOSFETs).

Progressively, integrated circuits are being made to smaller and smaller dimensions. Producing smaller dimensions generally means forming junctions for integrated circuit transistors that are shallower. These shallower junctions may have relatively low resistivity to maintain the current drive of the resulting transistors. Generally, producing lower resistance junctions involves increasing junction doping concentration. However, producing shallower junctions while increasing doping concentration may be difficult because of the limits imposed by dopant solid solubility in silicon.

In other words, it is desirable to make shallow, heavily doped junctions, but these two goals may be inconsistent with one another. In the past, junctions have been scaled using reduced energy ion implants and increased thermal ramp speeds in rapid thermal processing hardware. Increasing the ramp speed of the rapid thermal processing thermal anneal process allows a higher peak temperature that may improve solid solubility. The increase in solid solubility allows the incorporation of more dopants and, hence, lower sheet resistance for the same junction depth. Similarly, the faster anneal times reduce the amount of dopant diffusion.

The ion implant energy of the source/drain implant and source/drain extensions also contributes to a shallower junction. An ion implant can produce shallow, very high concentrations of dopants, but conventional rapid thermal processing technology cannot activate anymore dopant. The concentration of the source/drain extensions has reached the solid solubility limit of conventional rapid thermal processing.

Thus, there is a need for still shallower junctions while maintaining adequate resistivity.

DETAILED DESCRIPTION

Figure 1:
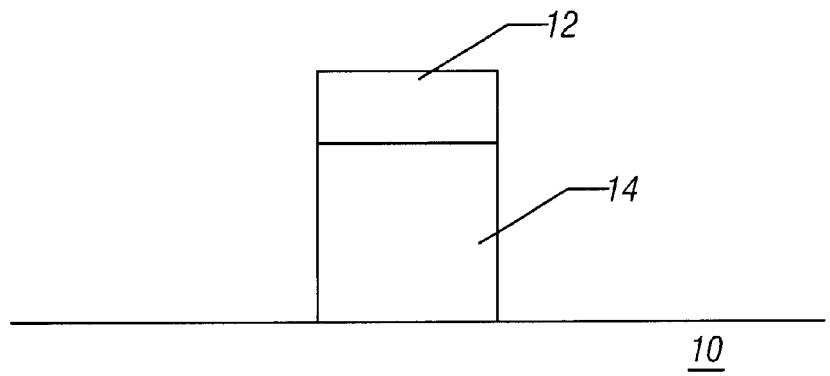
FIG. 1 is an enlarged cross-sectional view of one embodiment of the present invention at an early stage of manufacture.

Referring to FIG. 1, initially a cap layer 12 may be deposited on a polysilicon gate structure 14 to block implant of germanium into the polysilicon. This prevents both the excessive sputtering of the polysilicon by the high dose germanium implant and limits the germanium content. This is desirable because high concentrations of germanium retards the boron diffusion which will negatively impact poly depletion in the gate.

The gate structure 14 may be defined over a semiconductor structure 10.

Figure 2:
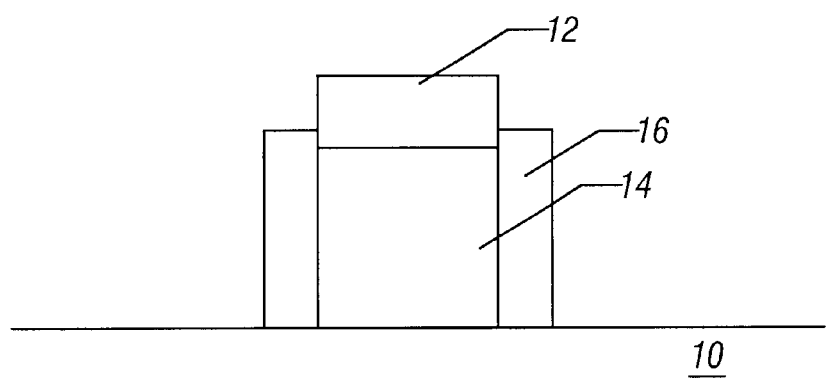
FIG. 2 is an enlarged cross-section of the embodiment shown in FIG. 1 after further processing in accordance with one embodiment of the present invention.
Figure 3:
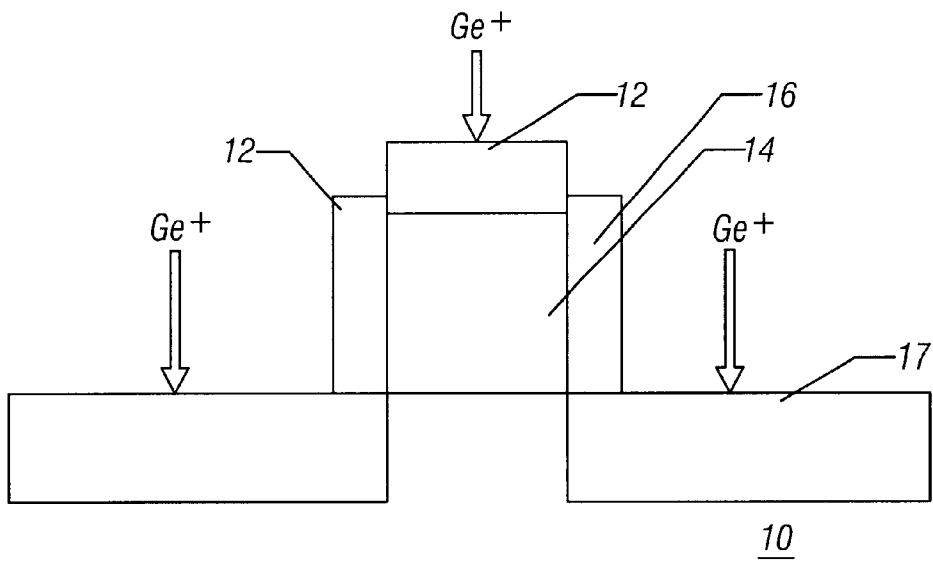
FIG. 3 is an enlarged cross-sectional view of the embodiment shown in FIG. 2 after further processing.

Removeable spacers 16 may be deposited and patterned to achieve the structure shown in FIG. 2. Then, the spacers 16 may act as masks, together with the cap layer 12, for a germanium high dose implant as shown in FIG. 3. By "high dose," it is intended to refer to a germanium implant that is of sufficiently high dose and energy to produce a substantial amount of strain in the resulting junction. For example, in some advantageous embodiments, the germanium implant dosage may be from about 2.0E16 to 6.0E16 atoms/cm2 at energies of at least 20 keV. In some embodiments an energy of about 50 keV is used.

In some embodiments, the germanium implant may also be deep enough to avoid consumption by a salicide. In some embodiments, this means that the implant is sufficient to produce an implanted depth greater than about 150 Angstroms.

Figure 4:
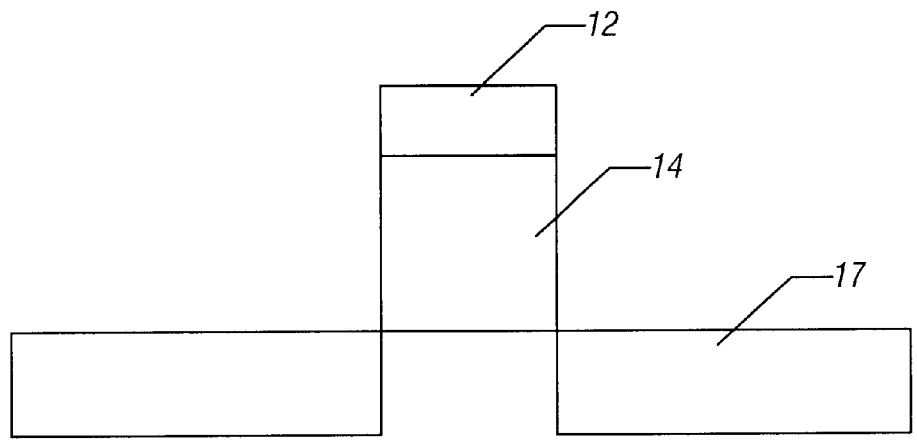
FIG. 4 is an enlarged cross-sectional view of the embodiment shown in FIG. 3 after further processing.
Figure 5:
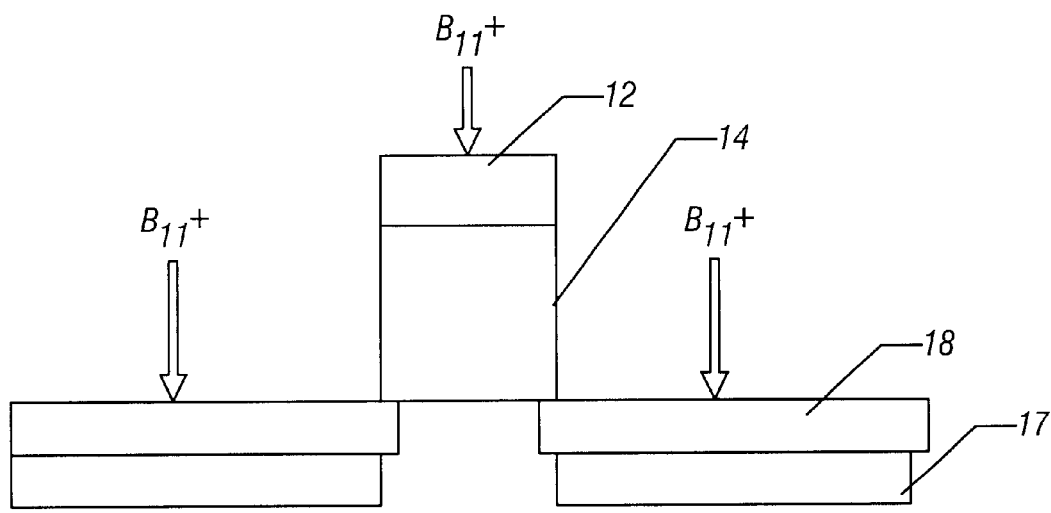
FIG. 5 is an enlarged cross-sectional view of the embodiment as shown in FIG. 4 after further processing.

Referring to FIG. 4, the spacers 16 may be removed, leaving the exposed germanium implanted regions 17 in the substrate 10. At this point, the P-type source/drain extension implant may be done. In one embodiment, the P-type source/drain extension implant may be Boron 11. As a result of the Boron implant, an implanted region 18 may be formed that overlaps the implanted region 17 that includes germanium as shown in FIG. 5.

Thereafter, conventional source/drain processing may be implemented, including the formation of a spacer for forming the deep source/drain regions of conventional source/drain junctions.

The addition of the high dose germanium implant to regions of high boron dose may produce favorable lattice interactions between boron and germanium. This may reduce defect, improve solid solubility and reduce boron diffusion, in some embodiments. of course, the resulting junctions may be shallower and have lower resistivity.

The addition of the high dose germanium implants also adds strain of the right sign to improve hole mobility for PMOS devices. The strained germanium and boron doped junctions behave like a classical alloy. The strain is reduced with increasing boron concentration for constant germanium dose. Advantageously, the implants are deep enough to avoid complete consumption by salicide formation.

A strained germanium source/drain can be implanted with a deep/high dose implant after spacer deposition, but before the high dose boron source drain implant. As shown in FIG. 2, a spacer 16 may be utilized in connection with the germanium implant. The spacer 16 may reduce gate edge damage in some cases as a result of implant straggle. After the removal of the spacer 16, in some embodiments, a poly reoxidation step may be done prior to doing a source/drain extension implant. After the source/drain extension implant, a spacer may be deposited in preparation for a conventional source/drain implant. Rapid thermal processing technology may be utilized to activate the implants.

An implant/rapid thermal processing technology for silicon germanium deposition may be simpler and more cost effective than epitaxial techniques from a process design perspective. In some embodiments no significant new integration schemes are necessary for implementation of the germanium implants.

Figure 6:
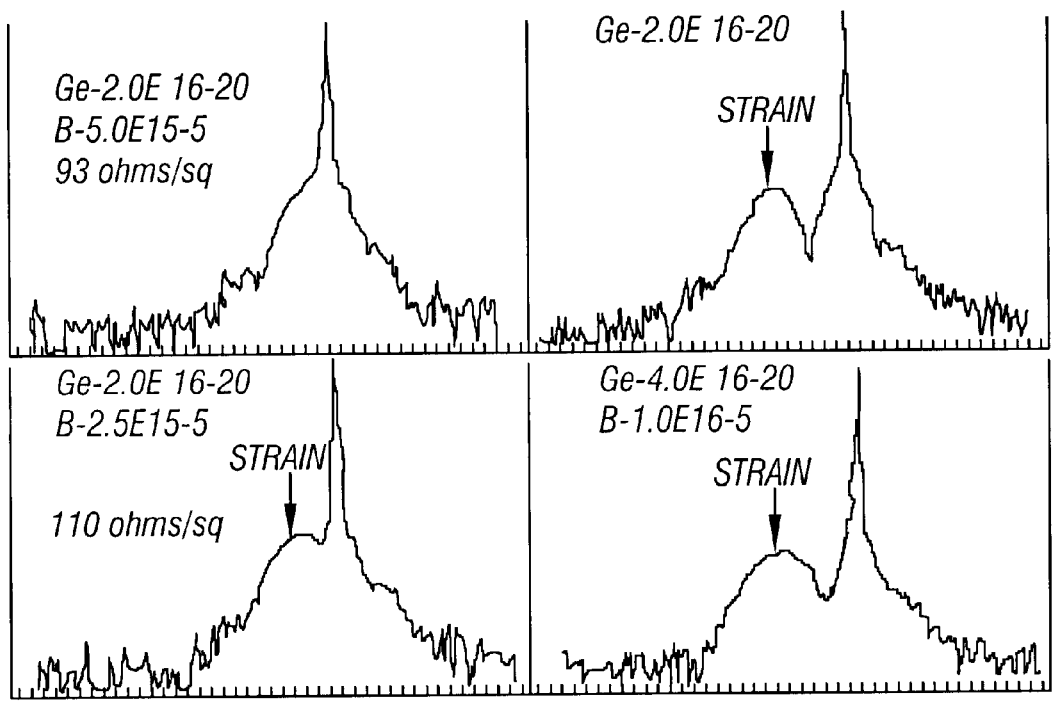
FIG. 6 is a graph of concentration versus depth for embodiments of the present invention.

By implanting germanium before the shallow source/drain extension implant, a shallower junction may be produced that has lower sheet resistivity because of the higher solid solubility of boron. In some embodiments stress is generated when the germanium concentration greatly exceeds that of boron. Referring to FIG. 6, the humps indicated by the arrows labeled "strain" are indicative of a strained lattice in some embodiments.

In some embodiments, the ratio of germanium to boron ions may be approximately 4 to 1. Generally, it is advantageous to have a ratio of germanium to boron ions greater than 1 to 1, because at 1 to 1 the atoms are complementary and cancel out the lattice strain.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:

implanting germanium at a dose greater than about 2E16 atoms/cm2; and forming a P-type source/drain extension in the region that has been implanted with germanium.

2. The method of claim 1 including implanting germanium using an energy of at least 10 keV.

3. The method of claim 1 including implanting the germanium to a depth greater than about 200 Angstroms.

4. The method of claim 1 wherein forming a P-type source/drain extension includes implanting boron into the region implanted with germanium.

5. The method of claim 1 including implanting the germanium using sidewall spacers on a polysilicon gate structure.

6. The method of claim 1 including forming a strained source/drain extension.

7. The method of claim 1 including implanting a P-type impurity into a region already implanted with germanium.

8. The method of claim 7 including implanting germanium and P-type impurity at a ratio greater than 1 to 1.

9. The method of claim 8 including implanting germanium and P-type impurity at a ratio of approximately 4 to 1.

10. The method of claim 9 wherein implanting P-type impurities includes implanting boron impurities.

11. A method comprising:

implanting germanium; and doping the region that has been implanted germanium with a P-type dopant to form a source/drain extension having a higher concentration of germanium ions than P-type ions.

12. The method of claim 11 including implanting germanium and the P-type impurity at a ratio greater than one to one.

13. The method of claim 12 including implanting germanium and the P-type impurity at a ratio of approximately four to one.

14. The method of claim 13 including implanting germanium at a dose greater than about 2E16 atoms/cm$^2$.

15. A method comprising:

forming a gate structure;

implanting germanium at a dose greater than about 2E16 atoms/cm$^2$ with said gate structure in place; and forming a P-type source/drain extension in the region that has been implanted with germanium.

16. The method of claim 15 including implanting germanium and a P-type impurity at a ratio greater than one to one.

17. The method of claim 16 including implanting germanium and a P-type impurity at a ratio of approximately four to one.

18. The method of claim 15 including applying a cap layer to said gate structure before implanting said germanium.

* * * * *